US009634040B2

(12) United States Patent
Guo et al.

(10) Patent No.: US 9,634,040 B2
(45) Date of Patent: Apr. 25, 2017

(54) ARRAY SUBSTRATE AND CURVED DISPLAY DEVICE

(71) Applicant: SHENZHEN CHINA STAR OPTOELECTRONICS TECHNOLOGY CO., LTD., Shenzhen (CN)

(72) Inventors: Jinbo Guo, Shenzhen (CN); Chuan Wu, Shenzhen (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 14/416,697

(22) PCT Filed: Jul. 3, 2014

(86) PCT No.: PCT/CN2014/081599
§ 371 (c)(1),
(2) Date: Jan. 23, 2015

(87) PCT Pub. No.: WO2015/188419
PCT Pub. Date: Dec. 17, 2015

(65) Prior Publication Data
US 2015/0357351 A1 Dec. 10, 2015

(30) Foreign Application Priority Data

Jun. 9, 2014 (CN) .......................... 2014 1 0252392

(51) Int. Cl.
*H01L 27/12* (2006.01)
*G02F 1/1362* (2006.01)
(Continued)

(52) U.S. Cl.
CPC ...... *H01L 27/1255* (2013.01); *G02F 1/13624* (2013.01); *G02F 1/136213* (2013.01);
(Continued)

(58) Field of Classification Search
CPC ............... H01L 27/1218; H01L 27/124; H01L 27/1225; H01L 27/1255; G09G 3/3648;
(Continued)

(56) References Cited

U.S. PATENT DOCUMENTS 8,149,344 B2 * 4/2012 Kao .................... G02F 1/13394
349/153
2004/0189885 A1 9/2004 Song
(Continued)

FOREIGN PATENT DOCUMENTS

| CN | 1580922 A | 2/2005 |
|----|-----------|--------|
| CN | 101211078 A | 7/2008 |

(Continued)

OTHER PUBLICATIONS

International Search Report (Forms PCT/ISA/210 and PCT/ISA/220) and the Written Opinion (Form PCT/ISA/237) issued on Mar. 4, 2015, by the State Intellectual Property Office of China acting as the International Searching Authority in corresponding International Application No. PCT/CN2014/081599. (12 pages).

(Continued)

*Primary Examiner* — William F Kraig
*Assistant Examiner* — Sun M Kim
(74) *Attorney, Agent, or Firm* — Buchanan Ingersoll & Rooney PC

(57) ABSTRACT

The Present disclosure relates to the field of display technology and discloses an array substrate and a curved display device which can solve the technical problem of dark area on both sides of the existing curved display device. The array substrate according to the present disclosure comprises a (Continued)

number of sub pixel units arranged as an array, each sub pixel unit comprising a main sub pixel, a secondary sub pixel and a voltage-dividing capacitor. Said array substrate is divided into a compensation region and a non-compensation region. The capacitance of the voltage-dividing capacitor of the sub pixel unit in the compensation region is smaller than that of the voltage-dividing capacitor of the sub pixel unit in the non-compensation region. The present disclosure is applicable to curved display devices such as curved television and curved display, etc.

15 Claims, 3 Drawing Sheets

(51) Int. Cl.
*G09G 3/36* (2006.01)
*G02F 1/1343* (2006.01)
(52) U.S. Cl.
CPC ............ *G09G 3/3648* (2013.01); *G02F 2001/134345* (2013.01); *H01L 27/124* (2013.01)
(58) Field of Classification Search
CPC ............ G02F 1/13624; G02F 1/136213; G02F 2001/134345
See application file for complete search history.

(56) References Cited

U.S. PATENT DOCUMENTS

| | | | |
|---|---|---|---|
| 2005/0030439 | A1 | 2/2005 | Lyu |
| 2007/0291191 | A1* | 12/2007 | Liu .................... G02F 1/136213 349/38 |
| 2008/0018573 | A1 | 1/2008 | Hsieh et al. |
| 2008/0158464 | A1 | 7/2008 | Chang et al. |
| 2009/0161048 | A1 | 6/2009 | Satake et al. |
| 2011/0260957 | A1* | 10/2011 | Jeong ................ G02F 1/133707 345/98 |
| 2012/0057091 | A1* | 3/2012 | Kawabata ........... G02F 1/13439 349/38 |
| 2015/0286102 | A1 | 10/2015 | Lo et al. |

FOREIGN PATENT DOCUMENTS

| | | |
|---|---|---|
| CN | 101464582 A | 6/2009 |
| CN | 103676389 A | 3/2014 |
| JP | 2009-115933 A | 5/2009 |
| TW | 200802257 A | 1/2008 |

OTHER PUBLICATIONS

Office Action issued on Mar. 23, 2016, by the State Intellectual Property Office of the People's Republic of China in corresponding Chinese Patent Application No. 201410252392.0. (5 pages).

* cited by examiner

ARRAY SUBSTRATE AND CURVED DISPLAY DEVICE

The present disclosure claims benefit of Chinese patent application CN 201410252392.0, entitled "Array Substrate and Curved Display Device" and filed on Jun. 9, 2014, which is incorporated herein by reference.

TECHNICAL FIELD

The present disclosure relates to the technical field of display technology. Specifically, it relates to an array substrate and a curved display device.

TECHNICAL BACKGROUND

A curved display device comprises a display screen having a curved shape. Because pixels on the screen of the curved display device each can have the same distance from the human eyes, a true visual perception can be perfectly revivified. Thus, a curved display device is more competitive as compared with a traditional flat panel display device.

The process of manufacturing a curved display device comprises the following steps: separately manufacturing an array substrate and a color film substrate first; then assembling the array substrate and the color film substrate together to form a planar liquid crystal panel; and further bending the planar liquid crystal panel into an inwardly curved liquid crystal panel. A number of gate lines and data lines staggered with each other, as well as sub pixel units formed by the gate lines and data lines are arranged on the array substrate. A latticed black matrix and sub pixel units formed by the black matrix are arranged on the color film substrate. On the planar liquid crystal panel formed by assembling the array substrate and the color substrate, the position of the black matrix on the color film substrate corresponds to the position of the gate lines and data lines on the array substrate, so that the black matrix blocks the gate lines and data lines. The position of the sub pixel area on the color film substrate corresponds to that on the array substrate so as to form an aperture region of the curved display device.

However, two curved surfaces having the same shape will be formed respectively on the array substrate and the color film substrate after the planar liquid crystal panel is bent into a curved one. In this case, dislocations would occur between the color film substrate and the array substrate on both sides of the curved liquid crystal panel. In particular, the black matrix on both sides of the color film substrate would mismatch with the longitudinal data lines on the array substrate. Some of these data lines would be exposed outside the black matrix and thus block the sub pixel area on the color film substrate, causing a decrease of aperture ratio in this region and further resulting in dark area on both sides of the curved display device.

SUMMARY OF THE INVENTION

The present disclosure aims to provide an array substrate for solving the technical problem of dark area on both sides of the existing curved display device.

The present disclosure provides an array substrate comprising a number of sub pixel units arranged as an array, each sub pixel unit comprising a main sub pixel, a secondary sub pixel and a voltage-dividing capacitor, wherein said array substrate is divided into a compensation region and a non-compensation region, and the capacitance of the voltage-dividing capacitor of the sub pixel unit in the compensation region is smaller than that of the voltage-dividing capacitor of the sub pixel unit in the non-compensation region.

Further, the compensation region is disposed at both sides of the array substrate.

Preferably, the compensation region is in the shape of an ellipse.

Further, the array substrate comprising a first gate line, a second gate line, and a common electrode line provided for each row of the sub pixel units, and a data line provided for each column of the sub pixel units.

Further, a voltage-dividing electrode is arranged in each sub pixel unit, and said voltage-dividing capacitor is formed by the overlapping proportion between the voltage-dividing electrode and the common electrode line.

Further, the area of the voltage-dividing electrode of the sub pixel unit in the compensation region is smaller than that of the voltage-dividing electrode of the sub pixel unit in the non-compensation region.

Further, each sub pixel unit further comprises a first switching element, a second switching element, a third switching element, a main pixel electrode disposed inside the main sub pixel, and a secondary pixel electrode disposed inside the secondary sub pixel, said first switching element is connected to the first gate line with its gate electrode, and to the data line with its source electrode, and to the main pixel electrode with its drain electrode, said second switching element is connected to the first gate line with its gate electrode, and to the data line with its source electrode, and to the secondary pixel electrode with its drain electrode, and said third switching element is connected to the second gate line with its gate electrode, and to the secondary pixel electrode with its source electrode, and to the voltage-dividing electrode with its drain electrode.

Preferably, the first switching element, the second switching element, and the third switching element are all thin film transistors.

The present disclosure further provides a curved display device comprising a color film substrate and said array substrate.

Preferably, said curved display device is a vertical alignment type display device.

The present disclosure achieves the following desirable effects: the compensation region on the array substrate according to the present disclosure is a region where dislocation occurs between the array substrate and the color film substrate, i.e. the region having a decreased aperture ratio; and the rest region of the panel having a normal aperture ratio is the non-compensation region. During displaying, the main sub pixel and the secondary sub pixel in each sub pixel unit of the array substrate are charged with the same data voltage first. Then, a part of the data voltage is divided from the secondary sub pixel through the voltage-dividing capacitor, so as to reduce the data voltage therein. The data voltage of the main sub pixel remains the same, so that the brightness of the secondary sub pixel is lower than that of the main sub pixel.

In the array substrate according to the present disclosure, the capacitance of the voltage-dividing capacitor of the sub pixel unit in the compensation region is smaller as compared with that in the non-compensation region. Thus, the data voltage divided from the secondary sub pixel by the voltage-dividing capacitor is relatively small, and thus the remaining data voltage in the secondary sub pixel is relatively high. In this way, the brightness displayed by the secondary sub pixel is relatively high, and therefore the brightness of the entire sub pixel unit is relatively high. Consequently, an array substrate provided by the present disclosure can enable the sub pixel unit in the compensation region (i.e., the region with a decreased aperture ratio) to display a higher brightness than the sub pixel unit in the non-compensation region (i.e., the region with normal aperture ratio), so that the brightness of the compensation region can be close to that of the non-compensation region, thereby solving the technical problem of dark area on both sides of the curved display device.

Other features and advantages of the present disclosure will be further explained in the following description and partially become obvious therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

In order to clarify the technical solutions of the embodiments of the present disclosure, the drawings relating to the embodiments will be explained briefly.

DETAILED DESCRIPTION OF THE EMBODIMENTS

Figure 1:
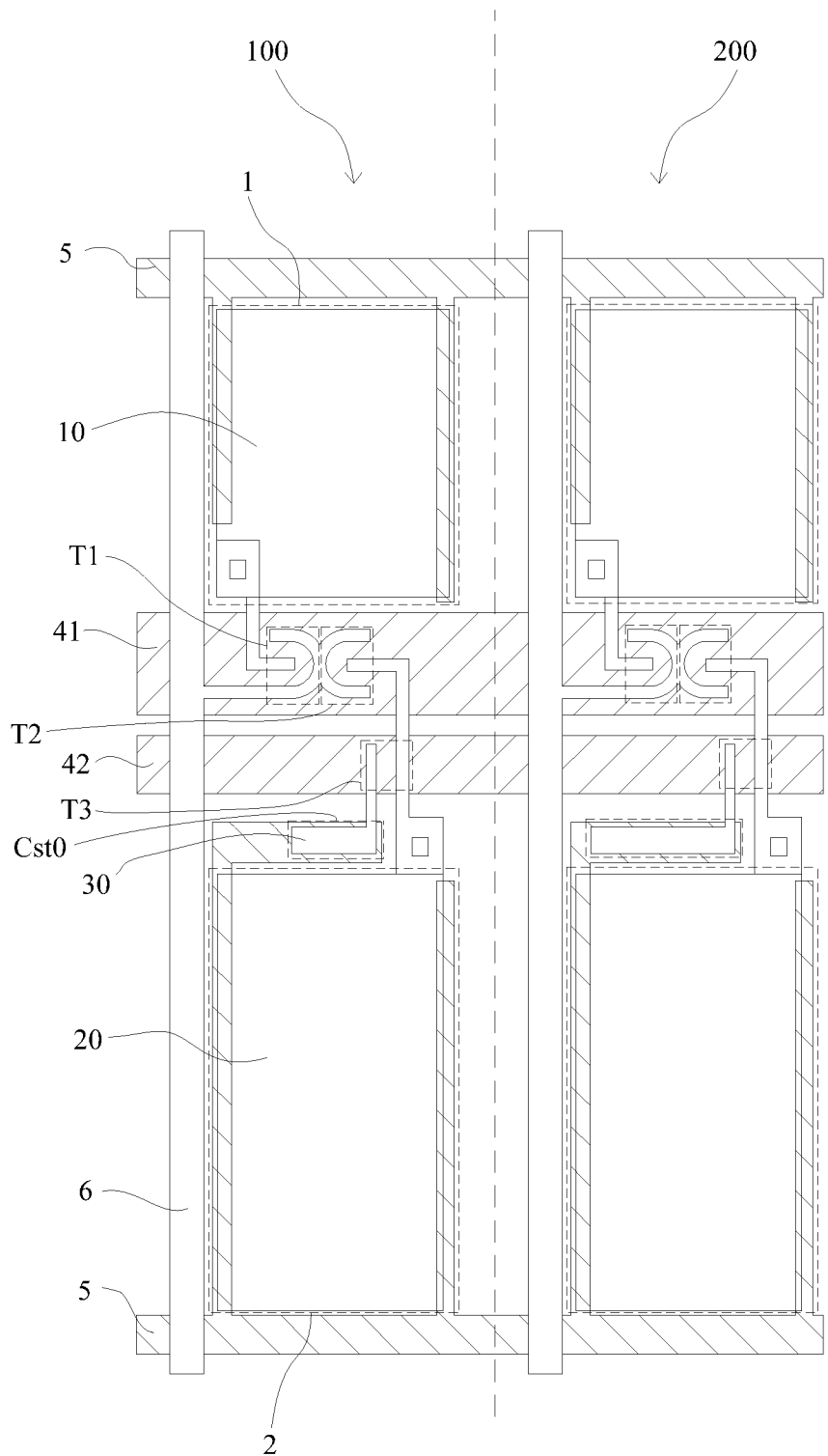
FIG. 1 schematically shows a part of an array substrate according to Example 1 of the present disclosure.

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It is important to note that as long as there is no structural conflict, all the technical features mentioned in all the embodiments may be combined together in any manner, and the technical solutions obtained in this manner all fall within the scope of the present disclosure.

The present disclosure provides an array substrate comprising a number of sub pixel units arranged as an array, each sub pixel unit comprising a main sub pixel, a secondary sub pixel, and a voltage-dividing capacitor. Said array substrate is divided into a compensation region and a non-compensation region, and the capacitance of the voltage-dividing capacitor of the sub pixel unit in the compensation region is smaller than that of the voltage-dividing capacitor of the sub pixel unit in the non-compensation region.

The compensation region on the array substrate according to an embodiment of the present disclosure is a region where dislocation occurs between the array substrate and the color film substrate, i.e. the region having a decreased aperture ratio; and the rest region of the panel having a normal aperture ratio is the non-compensation region. During displaying, the main sub pixel and the secondary sub pixel in each sub pixel unit of the array substrate are charged with the same data voltage first. Then, a part of the data voltage is divided from the secondary sub pixel through the voltage-dividing capacitor, so as to reduce the data voltage therein. The data voltage of the main sub pixel remains the same, so that the brightness of the secondary sub pixel is lower than that of the main sub pixel.

In the array substrate according to an embodiment of the present disclosure, the capacitance of the voltage-dividing capacitor of the sub pixel unit in the compensation region is smaller as compared with that in the non-compensation region. Thus, the data voltage divided from the secondary sub pixel by the voltage-diving capacitor is relatively small, and thus the remaining data voltage in the secondary sub pixel is relatively high. In this way, the brightness displayed by the secondary sub pixel is relatively high, and therefore the brightness of the entire sub pixel unit is relatively high. Consequently, an array substrate provided by an example according to the present disclosure can enable the sub pixel unit in the compensation region (i.e., the region with a decreased aperture ratio) to display a higher brightness than the sub pixel unit in the non-compensation region (i.e., the region with normal aperture ratio), so that the brightness of the compensation region can be close to that of the non-compensation region, thereby solving the technical problem of dark area on both sides of the curved display device.

Example 1

Figure 2:
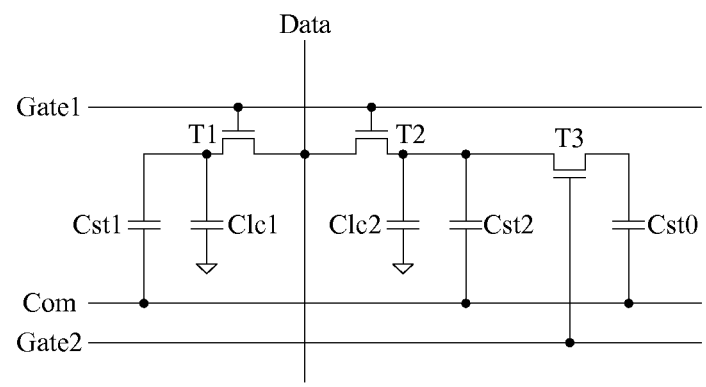
FIG. 2 shows an equivalent circuit diagram of the sub pixel units of the array substrate according to Example 1 of the present disclosure FIG. 3 schematically shows the array substrate according to Example 1 of the present disclosure.
Figure 4:
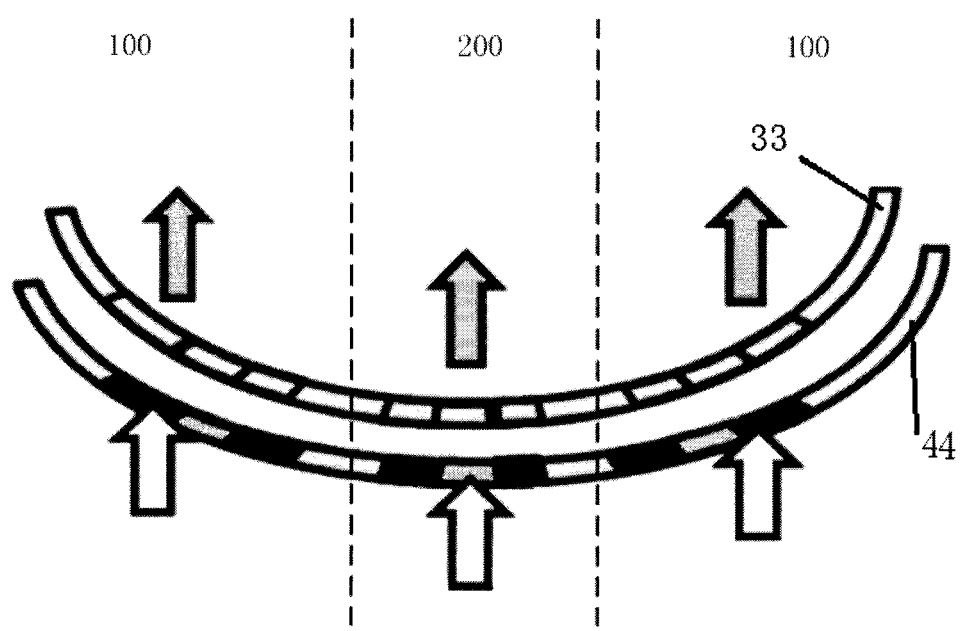
FIG. 4 schematically shows a curved display according to an embodiment of the present disclosure.

The array substrate 33, as shown in FIG. 4, according to Example 1 of the present disclosure comprises a number of sub pixel units arranged as an array. As shown in FIGS. 1 and 2, each sub pixel unit comprises a main sub pixel 1, a secondary sub pixel 2, and a voltage-dividing capacitor (Cst0) 3. The array substrate 33 is divided into a compensation region 100 and a non-compensation region 200. The capacitance of the voltage-dividing capacitor 3 in the compensation region 100 is smaller than that of the voltage-dividing capacitor 3 in the non-compensation region 200.

Figure 3:
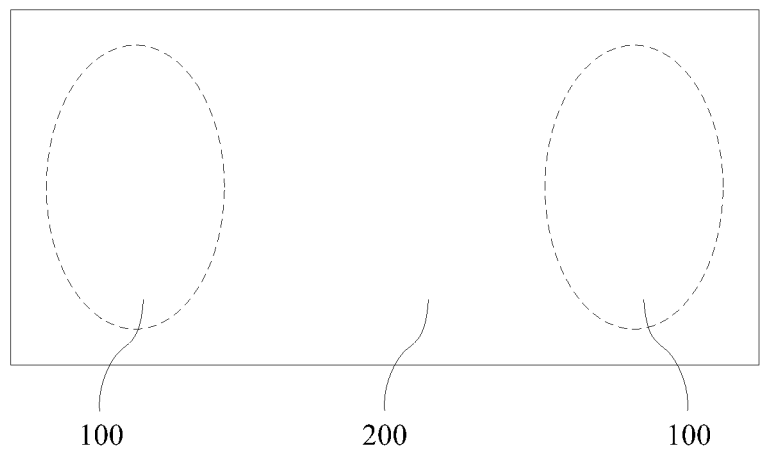

As shown in FIGS. 3 and 4, in Example 1, the compensation 100 is the region where dislocation occurs between the array substrate 33 and the color film substrate 44, i.e. the region having a decreased aperture ratio, and the rest region having a normal aperture ratio is the non-compensation region 200. After the array substrate 33 and the color film substrate 44 are assembled and bent into a curved liquid crystal panel, dislocation between the array substrate 33 and the color film substrate 44 would occur on both sides of the curved liquid crystal panel. Therefore, the region with a decreased aperture ratio is also located at both sides of the curved liquid crystal panel. Because the array substrate 33 and the color film substrate 44 are secured together by frame glue at the edges thereof, dislocation would barely occur around the edges of the curved liquid crystal panel, thus enabling the region having a decreased aperture ratio elliptical. Therefore, according to Example 1, the compensation region 100 is also located at both sides of the array substrate with an elliptical shape. The rest of the panel is the non-compensation region 200, which includes a central portion and edges of the array substrate.

As shown in FIGS. 1 and 2, the array substrate 33 according to Example 1 of the present disclosure further comprises a first gate line (Gate1) 41, a second gate line (Gate2) 42, and a common electrode line (Com) 5 provided for each row of sub pixel units, as well as a data line (Data) 6 provided for each column of sub pixel units. A voltage-dividing electrode 30 is arranged in each sub pixel unit, and said voltage-dividing capacitor Cst0 is formed by the overlapping portion between the voltage-dividing electrode 30 and the common electrode line 5. The first gate line 41, the second gate line 42, and the common electrode line 5 are arranged in the same layer, thus being formed in the same patterning step; and the data line 6 and the voltage-dividing electrode 30 are arranged in the same layer, thus being formed in the same patterning step.

According to Example 1, the area of the voltage-dividing electrode 30 in the compensation region 100 is smaller than that of the voltage-dividing electrode 30 in the non-compensation region 200, rendering the capacitance of the voltage-dividing capacitor Cst0 in the sub pixel unit in the compensation region 100 relatively small.

Furthermore, in Example 1, each sub pixel unit is provided with a first switching element T1, a second switching element T2, a third switching element T3, a main pixel electrode 10 located in a main sub pixel 1, and a secondary pixel electrode 20 located in a secondary sub pixel 2. T1, T2, and T3 are preferably all thin film transistors (TFT). A main liquid crystal capacitor Clc1 can be formed by the main pixel electrode 10 and common electrode (not shown) of the color film substrate 44, and a main storage capacitor Cst1 can be formed by an overlapping portion between the main pixel electrode 10 and the common electrode line 5. A secondary liquid crystal capacitor Clc2 can be formed by the secondary pixel electrode 20 and the common electrode of the color film substrate 44, and a secondary storage capacitor Cst2 can be formed by an overlapping portion between the secondary pixel electrode 20 and the common electrode line 5.

As shown in FIGS. 1 and 2, T1 is connected to the first gate line 41 with its gate electrode, to the data line 6 with its source electrode, and to the main pixel electrode 10 with its drain electrode. T2 is connected to the first gate line 41 with its gate electrode, to the data line 6 with its source electrode, and to the secondary pixel electrode 20 with its drain electrode. T3 is connected to the second gate line 42 with its gate electrode, to the secondary pixel electrode 20 with its source electrode, and to the voltage-dividing electrode 30 with its drain electrode.

During displaying, at first, the first gate line 41 is turned on and the second gate line 42 is turned off, so that T1 and T2 are conductive and T3 is non-conductive. At the same time, the data line 6 charges the main pixel electrode 10 and the secondary pixel electrode 20 with the same data voltage respectively through T1 and T2, so that Clc1, Cst1, Clc2, and Cst2 have the same voltage. Then, the first gate line 41 is turned off and the second gate line 42 is turned on, so that T1 and T2 are non-conductive and T3 is conductive. By means of which, Cst0 would divide part of the data voltage of the secondary pixel electrode 20 through T3, lowering the data voltage thereof, such that the voltage of Clc2 and Cst2 is decreased while the voltage of Clc1 and Cst1 remains unchanged. In this case, the voltage of Clc2 is lower than the voltage of Clc1, rendering the brightness of the secondary sub pixel 2 lower than that of the main sub pixel 1. Besides, since the angles of deflection of the liquid crystals in the main sub pixel 1 and in the secondary sub pixel 2 are different from each other, the visual angle of the display panel can be enlarged.

In the array substrate according to an embodiment of the present disclosure, the capacitance of Cst0 of the sub pixel unit in the compensation region 100 is relatively small as compared with that in the non-compensation region 200, thus the data voltage divided by Cst0 from the secondary pixel electrode 20 is relatively small. As a result, the remaining voltage of Clc2 is relatively high, and the brightness of the secondary sub pixel 2 is relatively high, rendering the brightness of the entire sub pixel unit relatively high.

Consequently, an array substrate provided by an embodiment according to the present disclosure can enable the sub pixel unit in the compensation region 100 (i.e., the region with decreased aperture ratio) to display a higher brightness than the sub pixel unit in the non-compensation region 200 (i.e., the region with normal aperture ratio), so that the brightness of the compensation region can be close to that of the non-compensation region 200, thereby solving the technical problem of dark area on both sides of the curved display device.

When an array substrate is designed and manufactured, the variation of aperture ratio of the compensation region 100 can be calculated based on the offset of the dislocation between the array substrate and the color film substrate. Accordingly, the brightness increase needed by the compensation region 100 can be calculated based on the variation of aperture ratio, thereby obtaining the required area of the voltage-dividing electrode 30 in the sub pixel unit of the compensation region 100. An array substrate designed and manufactured according to the thus-obtained area of the voltage-dividing electrode 30 can well compensate the adverse effect brought about by the decreased aperture ratio caused by the dislocation between the array substrate and the color film substrate, thereby realizing uniform brightness over the curved display device.

Example 2

The present disclosure further provides a curved display device, which can be a curved television or a curved display, etc. Said curved display device comprises a color film substrate 44, and an array substrate 33 according to Example 1.

The curved display device according to Example 2 comprises the same technical features as the array substrate 33 according to Example 1, thus can solve the same technical problem and achieve the same technical effect.

Preferably, the curved display device is of vertical alignment (VA) type. In a VA type curved display device, by dividing each sub pixel into a main sub pixel and a secondary sub pixel and configuring the liquid crystals in the main sub pixel and the secondary sub pixel with different angles of deflection, the visual angle of the curved display device can be enlarged.

In Example 2, because the liquid crystal capacitance of the secondary sub pixels in the compensation region is different from that of the secondary sub pixels in the non-compensation region, the angles of deflection of the liquid crystals in the secondary sub pixels are also different, thereby further enlarging the visual angle of the curved display device.

The above embodiments are described only for better understanding, rather than restricting, the present disclosure. Any person skilled in the art can make amendments to the implementing forms or details without departing from the spirit and scope of the present disclosure. The scope of present disclosure should still be subjected to the scope defined in the claims.

The invention claimed is:

1. An array substrate for a curved display device, comprising a number of first pixel units and second pixel units arranged as an array, each of the first pixel units and second pixel units comprising a main sub pixel, a secondary sub pixel and a voltage-dividing capacitor, wherein the curved display device comprises a center and two bent sides, wherein said array substrate is divided into a compensation region and a non-compensation region, and the capacitance of the voltage-dividing capacitor of the first pixel unit positioned in the compensation region is smaller than that of the voltage-dividing capacitor of the second pixel unit positioned in the non-compensation region, wherein the compensation region is positioned only at both bent sides of the array substrate, wherein the first pixel units are only positioned in the compensation region.

2. The array substrate according to claim 1, wherein the compensation region is in the shape of an ellipse.

3. The array substrate according to claim 1, further comprising:
- a first gate line, a second gate line, and a common electrode line provided for each row of the first and second pixel units, and
- a data line provided for each column of the first and second pixel units.

4. The array substrate according to claim 3, wherein a voltage-dividing electrode is arranged in each of the first and second pixel units, and said voltage-dividing capacitor is formed by the overlapping portion between the voltage-dividing electrode and the common electrode line.

5. The array substrate according to claim 4, wherein the area of the voltage-dividing electrode of the first pixel unit in the compensation region is smaller than that of the voltage-dividing electrode of the second pixel unit in the non-compensation region.

6. The array substrate according to claim 4, wherein each of the first and second pixel units further comprises a first switching element, a second switching element, a third switching element, a main pixel electrode disposed inside the main sub pixel, and a secondary pixel electrode disposed inside the secondary sub pixel,
- said first switching element is connected to the first gate line with its gate electrode, and to the data line with its source electrode, and to the main pixel electrode with its drain electrode,
- said second switching element is connected to the first gate line with its gate electrode, and to the data line with its source electrode, and to the secondary pixel electrode with its drain electrode, and
- said third switching element is connected to the second gate line with its gate electrode, and to the secondary pixel electrode with its source electrode, and to the voltage-dividing electrode with its drain electrode.

7. The array substrate according to claim 6, wherein the first switching element, the second switching element, and the third switching element are all thin film transistors.

8. A curved display device, comprising a color film substrate and an array substrate,
wherein the curved display device comprises a center and two bent sides,
wherein said array substrate comprises a plurality of first pixel units and second pixel units arranged as an array, a first pixel unit and a second pixel unit each comprising a main sub pixel, a secondary sub pixel and a voltage-dividing capacitor, and said array substrate is divided into a compensation region and a non-compensation region, and the capacitance of the voltage-dividing capacitor of the first pixel unit positioned in the compensation region is smaller than that of the voltage-dividing capacitor of the second pixel unit positioned in the non-compensation region, wherein the compensation region is positioned only at both bent sides of the array substrate, wherein the first pixel units are only positioned in the compensation region.

9. The curved display device according to claim 8, wherein the compensation region is in the shape of an ellipse.

10. The curved display device according to claim 8, further comprising
- a first gate line, a second gate line, and a common electrode line provided for each row of the first and second pixel units, and
- a data line provided for each column of the first and second pixel units.

11. The curved display device according to claim 10, wherein a voltage-dividing electrode is arranged in each of the first and second pixel units, and said voltage-dividing capacitor is formed by the overlapping portion between the voltage-dividing electrode and the common electrode line.

12. The curved display device according to claim 11, wherein the area of the voltage-dividing electrode of the first pixel unit in the compensation region is smaller than that of the voltage-dividing electrode of the second pixel unit in the non-compensation region.

13. The curved display device according to claim 11, wherein each of the first and second pixel units further comprises a first switching element, a second switching element, a third switching element, a main pixel electrode disposed inside the main sub pixel, and a secondary pixel electrode disposed inside the secondary sub pixel,
- said first switching element is connected to the first gate line with its gate electrode, and to the data line with its source electrode, and to the main pixel electrode with its drain electrode,
- said second switching element is connected to the first gate line with its gate electrode, and to the data line with its source electrode, and to the secondary pixel electrode with its drain electrode, and
- said third switching element is connected to the second gate line with its gate electrode, and to the secondary pixel electrode with its source electrode, and to the voltage-dividing electrode with its drain electrode.

14. The curved display device according to claim 13, wherein the first switching element, the second switching element, and the third switching element are all thin film transistors.

15. The curved display device according to claim 8, wherein said curved display device is a vertical alignment type display device.

* * * * *